United States Patent [19]

Tetsugu et al.

[11] 3,967,200

[45] June 29, 1976

[54] SPEED DETECTOR FOR USE WITH MINIATURE DC MOTOR

[75] Inventors: Yoshio Tetsugu, Katano; Tsunemi Mitsui, Osaka; Hiroshi Minakuchi, Kadoma, all of Japan

[73] Assignee: Matsushita Electric Industrial Co., Ltd., Japan

[22] Filed: Oct. 15, 1974

[21] Appl. No.: 514,841

[30] Foreign Application Priority Data

Oct. 26, 1973   Japan............................... 48-120881
May 17, 1974   Japan............................... 49-55875

[52] U.S. Cl................................ 324/173; 310/168; 310/113
[51] Int. Cl.²..................... G01P 3/48; H02K 47/14
[58] Field of Search............ 310/168, 113; 324/173, 324/174, 177

[56] References Cited
UNITED STATES PATENTS

| | | | |
|---|---|---|---|
| 2,814,745 | 11/1957 | Sinclair, Jr.......................... | 310/168 |
| 3,466,477 | 9/1969 | Newill.............................. | 324/173 X |
| 3,504,208 | 3/1970 | Rivers.............................. | 324/174 X |

FOREIGN PATENTS OR APPLICATIONS

| | | | |
|---|---|---|---|
| 1,180,588 | 2/1970 | United Kingdom................. | 324/173 |
| 154,105 | 7/1961 | U.S.S.R............................. | 324/173 |

*Primary Examiner*—John K. Corbin
*Assistant Examiner*—Rolf Hille
*Attorney, Agent, or Firm*—Burgess Ryan and Wayne

[57] ABSTRACT

A speed detector for use with a miniature DC motor is disclosed wherein a device such as coils or Hall generators for detecting the magnitude and direction of leakage flux are placed in opposed relationship with at least one pair of field poles of the DC motor, so that an output signal having a frequency proportional to an integral multiple of the number of slots of the armature may be derived.

4 Claims, 13 Drawing Figures

SPEED DETECTOR FOR USE WITH MINIATURE DC MOTOR

BACKGROUND OF THE INVENTION:

The present invention relates to generally to a speed detector for use with a miniature DC motor, and more particularly to a speed detector of the type used for measuring the rotational speed of the miniature DC motor by detecting the magnitude and direction of leakage flux from the field pole assembly.

One type of the conventional speed detectors for use with miniature DC motors comprises, in general, a toothed wheel made of magnetic material and rigidly attached to the shaft of the DC motor. In addition, an exciting magnet and a magnetic detecting head are both mounted upon the frame of the DC motor. Upon rotation of the DC motor, the toothed wheel changes the magnetic path between the exciting magnet and the magnetic head so that an output signal having a frequency proportional to the rotational speed of the DC motor is derived from the output terminals of the magnetic head. The speed detector of the type described is, however, complex in construction, requires an additional space for installation of the speed detector outside of the DC motor, and consists of a relatively large number of parts, so that the productivity is low.

To overcome these inherent limitations, there has been proposed a speed detector of the type for detecting the rotational speed of the DC motor by detecting the variation of the leakage flux with a magnetic head. However, this device has an inherent deficiency in that the precise detection of the rotational speed cannot be made because the pulse-like noise produced when the armature current is interrupted and reversed in direction and the noise caused by the variation in contact resistance between the brushes and the commutator are both superimposed on the output signal.

SUMMARY OF THE INVENTION:

One of the objects of the present invention is therefore to provide a speed detector for use with a miniature DC motor which is extremely simple in construction and requires an extremely small space for installation.

Another object of the present invention is to provide a speed detector for use with a miniature DC motor which is capable of deriving a very stable relatively high frequency output waveform.

Briefly stated, according to the present invention, the magnitude and direction of the leakage fluxes from the field pole assembly are measured by detecting means such as coils or Hall generators which are placed in opposed relation with at least one pair of N- and S-poles, whereby the signal representative of the rotational speed of the armature may be derived from the output terminals of the detecting means.

BRIEF DESCRIPTION OF THE DRAWING:

Same reference numerals are used to designate similar parts throughout the figures.

Figure 1:
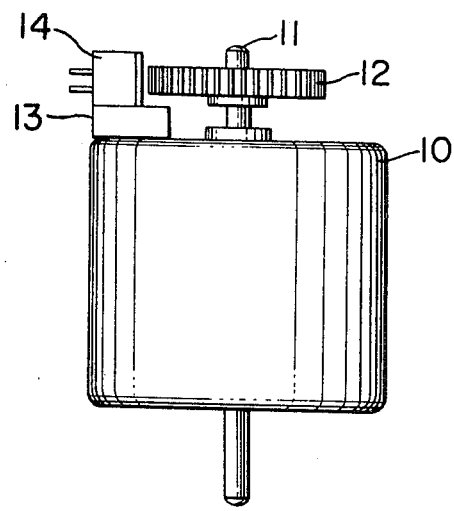
FIG. 1 is a schematic view of one of the conventional speed detector for use with miniature DC motors.

DESCRIPTION OF THE PREFERRED EMBODIMENTS:

Prior Art, FIG. 1

In order to specifically point out the problems of the prior art speed detectors, one example thereof will be briefly described with reference to FIG. 1 prior to the description of the preferred embodiments of the present invention. In FIG. 1, a toothed wheel 12 made of a magnetic material is attached to a shaft 11 of a DC motor 10, an exciting magnet 13 and a magnetic head 14 are mounted upon the frame of the DC motor 10. The magnetic path from the exciting magnet 13 to the magnetic head 14 is changed as the toothed wheel 12 rotates, so that an output signal with a frequency proportional to the rotational speed of the DC motor 10 may be derived from the output terminals of the magnetic head 14. However, the prior art speed detector of the type described is complex in construction, requires additional space for installation, and is not adapted for production with high productivity. To overcome these inherent limitations, there has been proposed a device for detecting the variation in leakage flux with a magnetic head, but this device has a distinct limitation in that the output of the magnetic head is superposed with the pulse-like noise produced when the current flowing through the armature coils is interrupted and reversed in direction, and with the noise produced due to the change in the contact resistance of the commutator.

Figure 2:
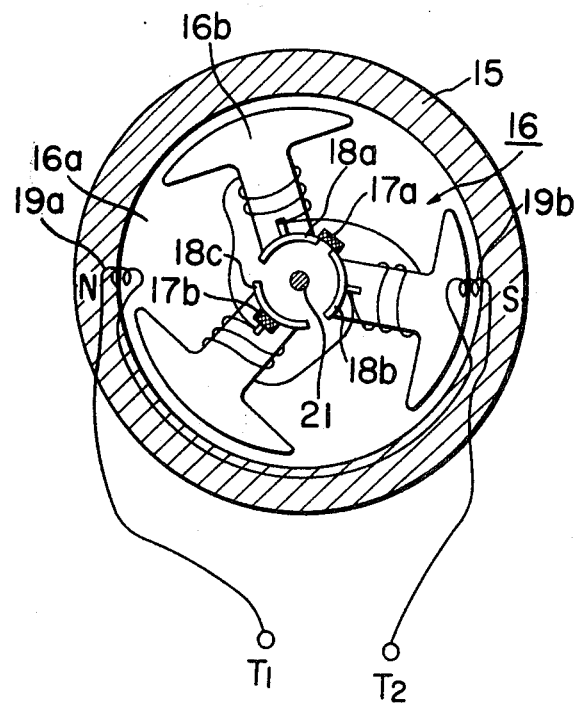
FIG. 2 is a schematic view of a first embodiment of the present invention viewed from line A–4 in FIG. 3.
Figure 3:
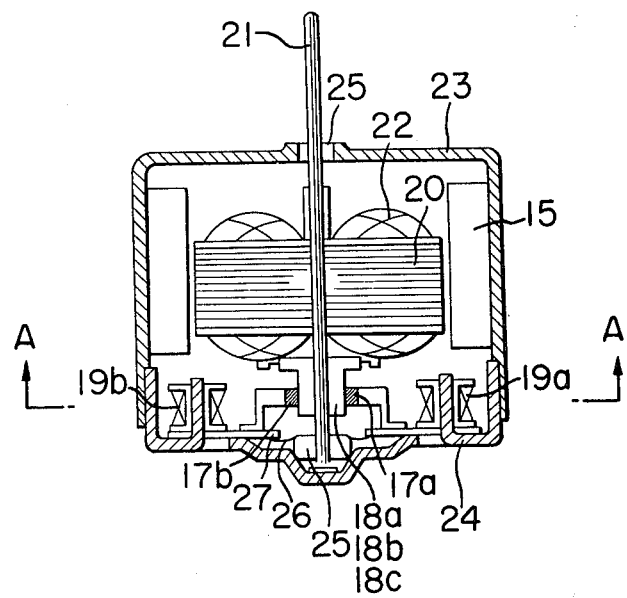
FIG. 3 is a sectional view thereof.

The Invention, First Embodiment, FIGS. 2, 3, and 4

Referring to FIGS. 2 and 3, a DC motor to which, is applied the present invention, comprises, in general, a field pole assembly 15 made of permanent magnet material, an armature 16 with an armature winding 22, a pair of brushes 17a and 17b, a commutator consisting of three commutator segments 18a, 18b, and 18c, and a frame 23. The armature 16 consists of an armature core 20, a shaft 21 and the armature winding 22. The DC motor further includes metal bearings 25, a bearing retaining spring 26, and a retainer 27.

According to the present invention, detecting means or coils 19a and 19b are supported on supports 24 (See FIG. 3) and disposed in opposed relationship with the N- and S-poles of the field pole assembly. The two detecting coils 19a and 19b have their an end connected to are of the output terminals $T_1$ and $T_2$, respectively, and are connected in series to each other with the same polarity.

Figure 4A:
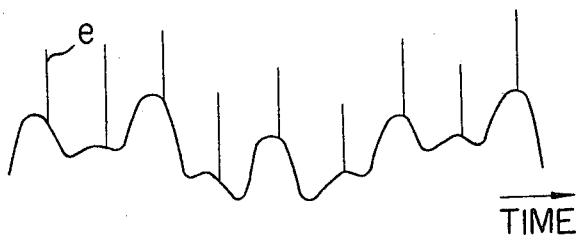
FIGS. 4A to 4C show signal waveforms used for the explanation of the mode of operation of the first embodiment.
Figure 4B:
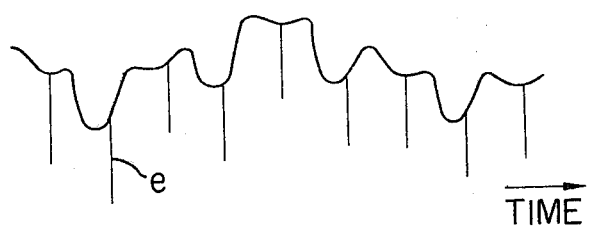

When the armature 16 rotates, the leakage fluxes passing through the detecting coils 19a and 19b change, and each of the detecting coils 19a and 19b picks up the magnitude and direction of the leakage flux passing therethrough. Therefore, signals as shown in FIGS. 4A and 4B are produced across the detecting coils 19a and 19b, respectively. Needle-shaped pulses $e$ are produced when the current flowing through the armature winding is reversed. Since the detecting coils 19a and 19b are placed in opposed relation with their N- and S-poles of the field pole assembly, respectively, the polarities of the needle-like pulses e in the signal waves shown FIGS. 4A and 4B are opposite. Because of the change in contact resistance between the brushes and the commutator and other factors, the signal waves detected across the coils 19a and 19b change with a relatively low frequency and are out of phase by 180°. Since the two detecting coils 19a and 19b are connected in series with the same polarity, the output signal waveform as shown in FIG. 4C is derived across the output terminals $T_1$ and $T_2$.

Figure 4C:
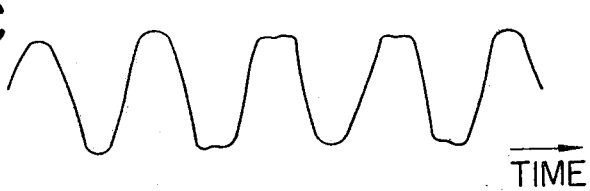

The signal shown in FIG. 4C is stable and free from the pulse-like noise produced in the armature winding and the noise caused by the variation in contact resistance between the brushes and the commutator.

The frequency of the output signal is proportional to the rotational speed and the number of slots 16a formed between armature poles 16b.

Instead of the detecting coils 19a and 19b, any other suitable magnetic detecting means such as Hall generators may be used. Moreover, more than one pair of detecting coils may be used.

Figure 5:
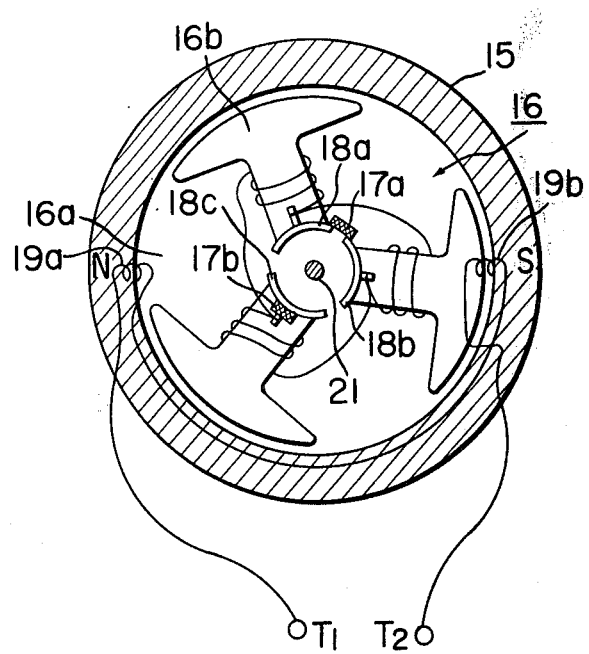
FIG. 5 is a schematic view of a second embodiment of the present invention viewed from line A-A in FIG. 3.

Second Embodiment, FIGS. 5 and 6

Figure 6A:
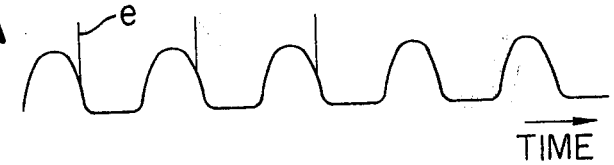
FIGS. 6A and 6D show signal waveforms used for the explanation of the mode of operation thereof.
Figure 6B:
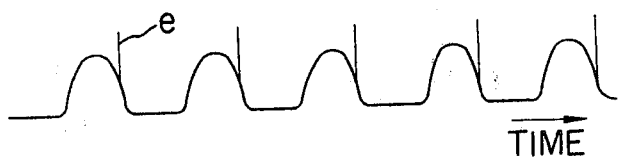
Figure 6C:
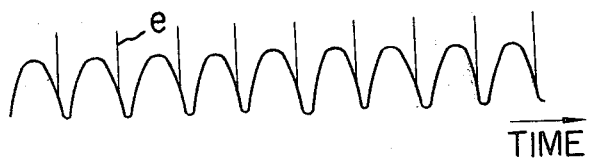
Figure 6D:
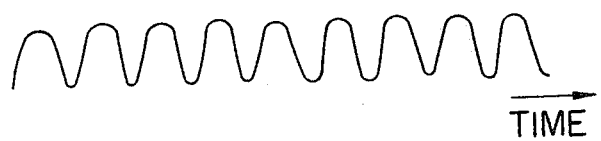

The second embodiment shown in FIG. 5 is substantially similar in construction to the first embodiment except that the detecting coils 19a and 19b are connected in series with opposite polarities. Upon rotation of the armature 16, the leakage fluxes passing through the detecting coils 19a and 19b of FIG. 5 change so that signals, which are out of phase by 180°, are derived across the detecting coils 19a and 19b as shown in FIGS. 6A and 6B, respectively. The frequency of the signal is proportional to the number of slots of the armature and the rotational speed. Therefore the signal wave as shown in FIG. 6C is derived across the output terminals $T_1$ and $T_2$, and has a frequency proportional to twice the number of slots of the armature. The needle-like pulses e, which are produced when the current flowing through the armature winding is reversed, may be eliminated in a simple manner by a suitable conventional filter consisting of capacitors and resistors. Thus, a speed signal free from noise may be derived as shown in FIG. 6D.

Figure 7A:
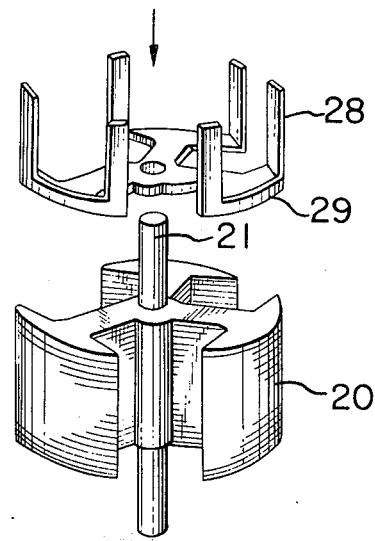
FIGS. 7A and 7B are exploded and perspective views of a third embodiment of the present invention.
Figure 7B:
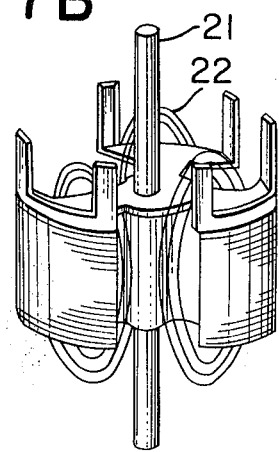

Third Embodiment, FIGS. 7A and 7B

When the leakage fluxes from the field pole assembly 15 are relatively large in magnitude, the first and second embodiments of the present invention may overcome the distortion of the detected output signal due to the armature reaction, so that an undistorted signal may be derived. However, when the leakage fluxes are small, the outputs of the detecting coils 19a and 19b are small and are affected by the armature reaction, so that an undistorted output signal may not be derived. The third embodiment shown in FIGS. 7A and 7B, however, may overcome the above problem. A detecting member 29 which is made of a magnetic material and is provided with a plurality of equiangularly spaced apart blades or projections 28 equal in number to the slots of the armature or equal to twice that number, is attached to the armature core 20. The detecting coils 19a and 19b are placed in the vicinity of the path of the blades or projections 28. Thus, the distortion of the signal wave due to the armature reaction may be overcome, so that an undistorted output signal may be derived.

What is claimed is:
1. A speed detector for use with a miniature DC motor comprising
    a. a field pole assembly made of permanent magnet material,
    b. an armature having said field pole assembly and having slots,
    c. detecting means for detecting the magnitudes and directions of the leakage fluxes from said field pole assembly, said detecting means being placed at least two positions in opposed relation with the N- and S-poles of said field pole assembly and remote from the area between the field pole assembly and the armature,
thereby deriving a speed signal from the output terminals of said detecting means.

2. A speed detector for use with a miniature DC motor as set forth in claim 1 wherein said detecting means are connected in series with the same polarity, whereby an output signal having a frequency proportional to the number of slots of said armature may be derived from the output terminals of said detecting means.

3. A speed detector for use with a miniature DC motor as set forth in claim 1 wherein said detecting means are connected in series with opposite polarities, whereby an output signal having a frequency proportional to twice the number of slots of said armature may be derived from the output terminals of said detecting means.

4. A speed detector for use with a miniature DC motor as set forth in claim 1 further comprising a detecting member made of a magnetic material and provided with N projections equiangularly spaced apart from each other, is formed integral, with the core of said armature, where N is equal to an integral multiple of the number of slots in said armature.

* * * * *